United States Patent

Hamilton

[11] Patent Number: 5,979,510
[45] Date of Patent: Nov. 9, 1999

[54] FORMING TOOL AND METHOD

[75] Inventor: Ernest J. Hamilton, Boise, Id.

[73] Assignee: Micron Technology, Inc., Boise, Id.

[21] Appl. No.: 09/025,170

[22] Filed: Feb. 18, 1998

[51] Int. Cl.$^6$ ........................................................ B21F 1/00
[52] U.S. Cl. ......................................... 140/105; 72/466.8
[58] Field of Search ............................ 140/105; 72/465.1, 72/466.9, DIG. 102

[56] References Cited

U.S. PATENT DOCUMENTS

| | | | |
|---|---|---|---|
| 2,911,014 | 11/1959 | Van Nest | 140/105 |
| 3,086,411 | 4/1963 | De Lancey | 72/466.8 |
| 3,696,846 | 10/1972 | Rotondo et al. | 140/105 |
| 5,135,034 | 8/1992 | Miyamoto | 140/105 |
| 5,158,121 | 10/1992 | Ishii | 140/105 |
| 5,375,630 | 12/1994 | Kim | 140/105 |

FOREIGN PATENT DOCUMENTS

| | | | |
|---|---|---|---|
| 3-230835 | 10/1991 | Japan | 140/105 |
| 1103928 | 7/1984 | Russian Federation | 140/105 |

Primary Examiner—Lowell A. Larson
Attorney, Agent, or Firm—Ormiston Korfanta & Holland, PLLC

[57] ABSTRACT

A pivot punch that has no explicit pivot point. In one embodiment, the tool includes a die, a punch holder pressable along a path toward the die and a punch supported by the punch holder. The punch extends through and is pivotable in an opening in the holder to move the lower part of the punch laterally toward the center of the die. In another embodiment, the upper part of the punch is held tightly in the holder. The lower part of the punch is flexible to move laterally toward the center of the die. A pivot punch that has no explicit pivot point. The punch is flexible and the punch pivot is permitted by the flexibility of the punch.

19 Claims, 10 Drawing Sheets

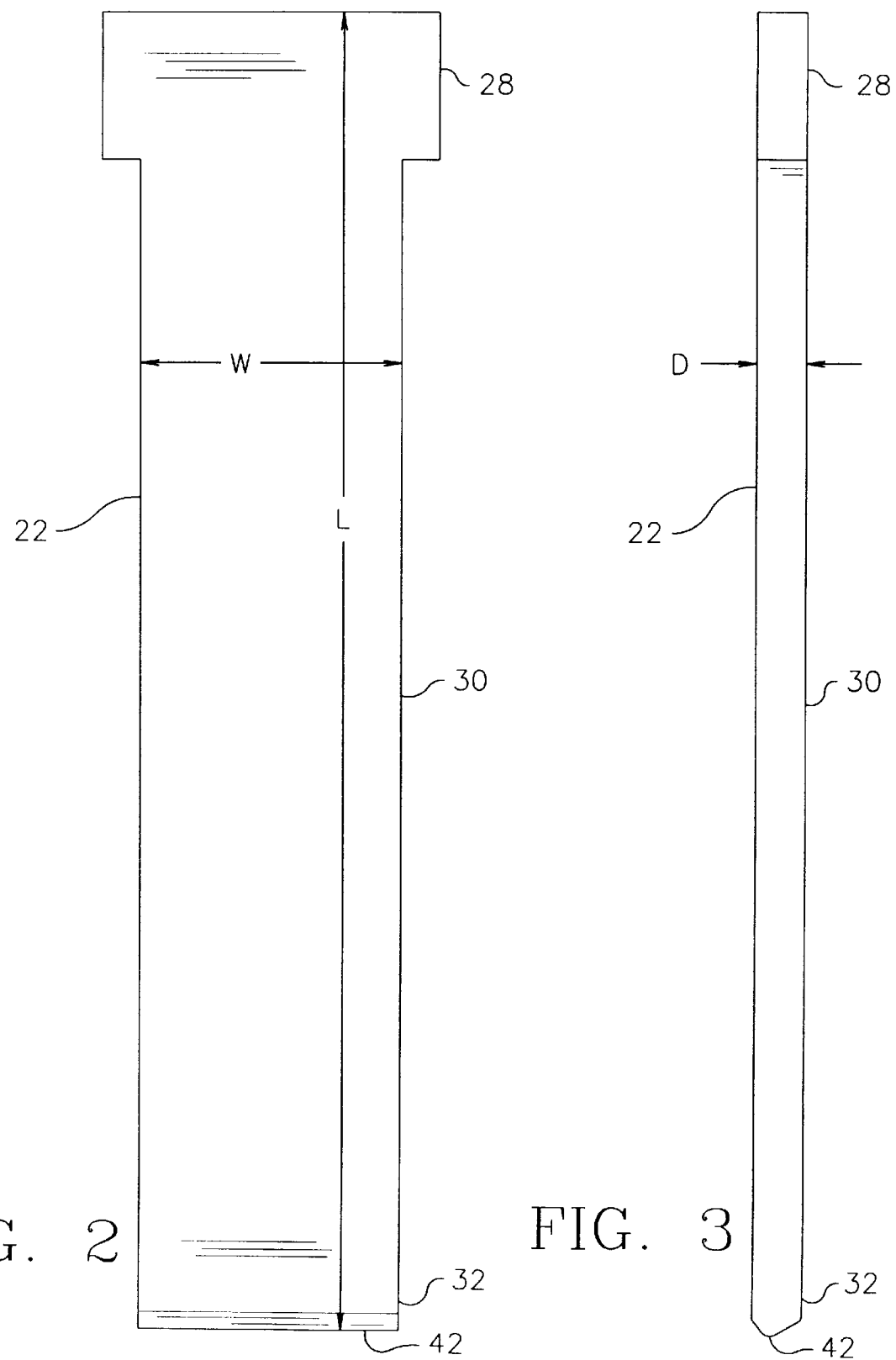

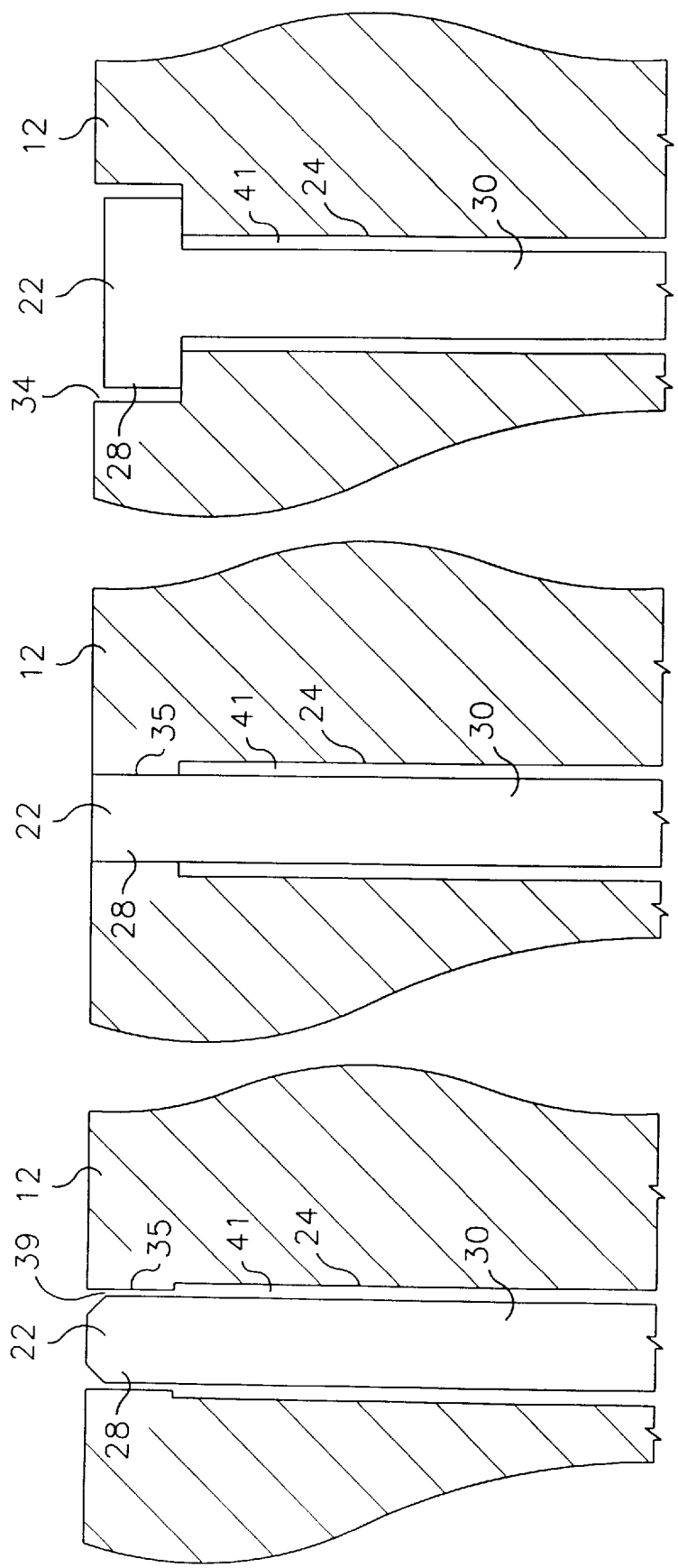

5,979,510

FORMING TOOL AND METHOD

FIELD OF THE INVENTION

The invention relates generally to forming tools and methods and, more particularly, to a semiconductor lead forming tool and method of forming semiconductor package leads.

BACKGROUND OF THE INVENTION

Many semiconductor devices, which are sometimes referred to as integrated circuit chips, are enclosed in a plastic, ceramic or similar protective material as part of the finished semiconductor package. Typically, a series of conductive leads project out from the protective material. The leads connect the chip to external circuits on a printed circuit board. The conductive leads are plugged in or soldered to the printed circuit board. Many different types of packages are commonly used in the manufacture of semiconductor devices. For example, single in line packages (SIPs) have a single row of conductive leads. Dual in line packages (DIPs) have two rows of leads. SIPs and DIPs are mounted on a printed circuit board by inserting the leads through holes in the board. By contrast, the leads of surface mounted packages are soldered to the printed circuit board. Small outline J lead packages (SOJs) with J shaped leads and thin small outlined packages (TSOPs) with gull wing shaped leads are examples of surface mounted packages.

At the end of the semiconductor manufacturing process, and after the chip has been enclosed in protective material, the conductive leads are trimmed and formed into the desired shape. Because molded plastic packages are the most common, the trim and form operations used in the manufacture of molded plastic packages will be described to provide further background for the invention. The individual semiconductor chips are attached to a metal lead frame. The number of frames on a strip depends on the size of the package, the spacing of the chips and the length of the strip. The chips on each lead frame strip are processed together. Thus, it is desirable to increase the number of chips on a leadframe strip to increase the capacity of the processing equipment. After the chips are encapsulated in plastic, the lead frame strip is conveyed through a series of presses in which excess plastic is cut from the package (called deflash), the resin dams are cut (called dedambar—the resin dams are bars in each lead frame that prevent the molten plastic from flowing out along the protruding conductive leads), and then the leads are cut from the lead frame (called leadshear). The leads are usually bent into the desired shape just before or after the leadshear.

The package is trimmed and the leads formed by moving the lead frame strips through a lead forming tool called a press, or a series of presses. Each press includes a die and a punch or a series of dies and punches. As a punch is pressed against a die (or, in some cases, the die is raised up against the punch), the semiconductor package is deflashed, dedambarred, leadsheared and the leads formed in the lead bending steps. During lead bending, shear forces tend to weaken or damage the leads. Also, the punch tends to slide across and scrape the surface of the leads. Tin, lead, palladium and other surface plating materials are often used on the conductive leads to improve the physical and electrical characteristics of the leads. Some of the plating material may be scraped off during lead bending. In addition to adversely effecting the characteristics of the lead, this plating material collects on the die and punch. As a result, the punch and die must be cleaned or replaced periodically.

In an effort to minimize damage to the leads and to reduce maintenance on the punch and die, some lead forming tools use a "pivot punch" instead of a straight punch. A pivot punch pivots into the leads as it is pressed into the die to reduce shear forces on and minimize surface damage to the leads. In a conventional pivot punch, the punch rotates on a pin. Although conventional pivot punches can be effective to reduce shear forces and minimize surface damage, they are not well suited to closely spaced chips on the lead frame strips. The "pitch" of a lead frame strip reflects the spacing of the lead frames and corresponds to the spacing of the semiconductor chips on each strip. For example, in a 0.6 inch pitch lead frame strip, each chip is spaced 0.6 inches from the adjacent chips. It would be difficult and expensive to fabricate and assemble a conventional pivot punch that would work well in this high pitch lead frame strip. The conventional pivot punch components would, in any event, be very fragile and unlikely to function effectively in production.

SUMMARY OF THE INVENTION

The present invention is directed to a novel pivot punch type of forming tool.

The tool comprises a pivot punch that has no explicit pivot point. In one embodiment of the invention, the tool includes a die, a punch holder pressable along a path toward the die and a punch supported by the punch holder. The punch extends through and is pivotable in an opening in the holder to move the lower end of the punch laterally toward the center of the die. In another embodiment, the upper end of the punch is held tightly in the holder. The lower end of the punch is flexible to move laterally toward the center of the die.

DESCRIPTION OF THE DRAWINGS

FIG. 2 is an elevation side view of the punch of FIG. 1.

FIG. 3 is an elevation end view of the punch of FIG. 1.

FIGS. 5A, 5B, 5C, 5D and 5E are detail cross section views from FIG. 1 showing different embodiments of the upper part of the punch.

DETAILED DESCRIPTION OF THE INVENTION

Figure 1:
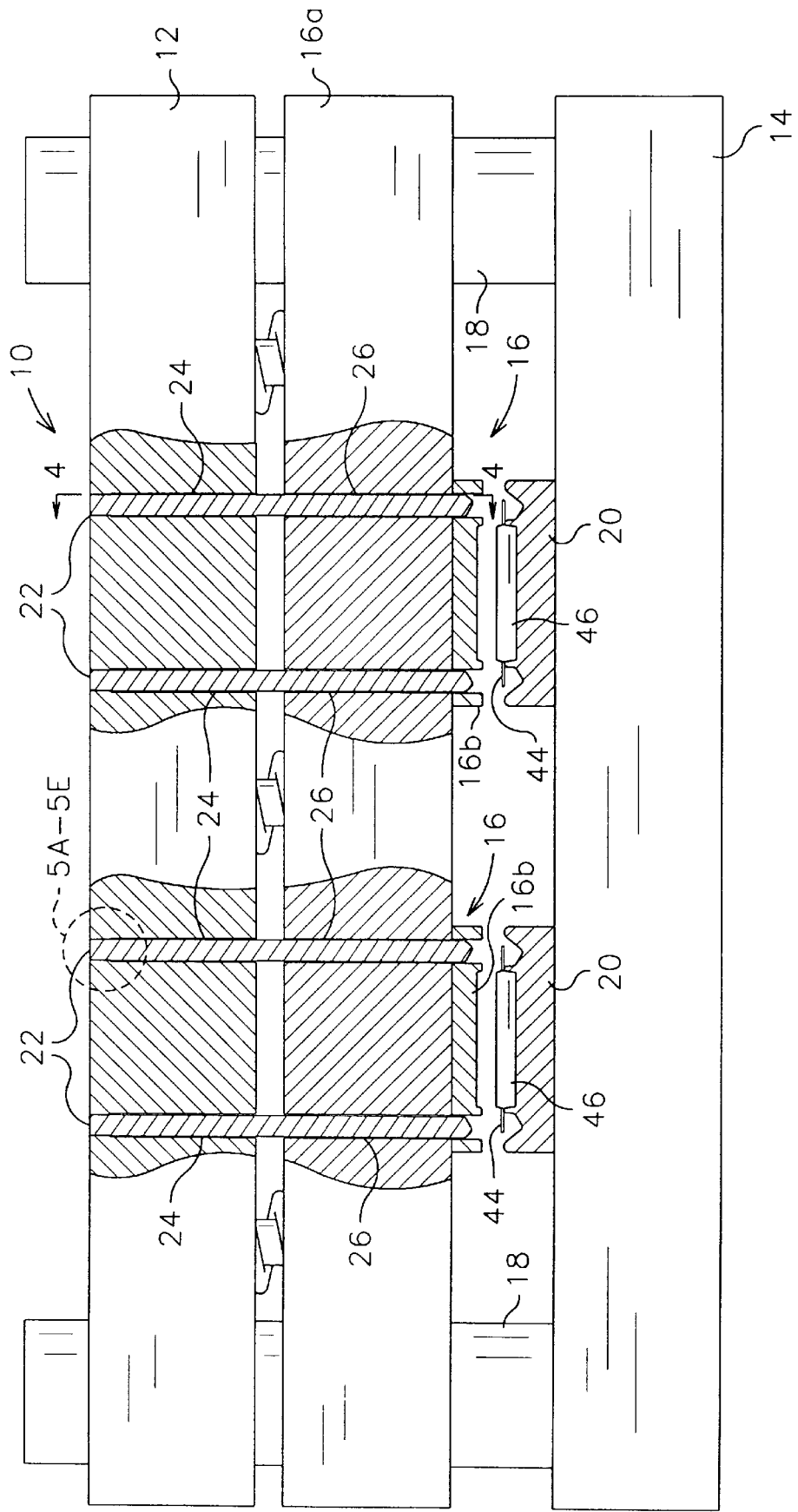
FIGS. 1 is a representational elevation view of a lead forming tool and a partial cut away cross section view of the punch holder, punch, stripper and die components of the lead forming tool.

Referring to FIG. 1, lead forming tool 10 includes a punch holder 12, a die base 14 and a stripper 16. As shown in FIG. 1, stripper 16 may include a base portion 16a and a replaceable stripper module 16b. A replaceable module 16b facilitates the use of lead forming tool 10 for a variety of different semiconductor packages and lead configurations. Punch holder 12 and stripper 16 are mounted to guide posts 18. Guide posts 18 are supported on base 14. A pair of dies 20 are positioned on base 14. Punches 22 are mounted in punch holder 12 and extend through openings 24 and 26 in punch holder 12 and stripper 16. Punches 22 are positioned over dies 20. Dies 20 may be replaced with different dies, depending on the nature of the semiconductor packages and the desired lead configuration. Also, each die 20 may include a separable center piece for supporting the semiconductor package and edge pieces against which the punch is pressed to bend the conductive leads. Although two parallel dies are shown for handling adjacent packages, lead forming tool 10 may be configured with any number of parallel and/or serial die sets, or a single die. Punch holder 12, base 14, stripper 16 and dies 20 depicted in FIG. 1 represent generally the components of conventional lead forming tools that may be adapted for use with the present invention.

Figure 4:
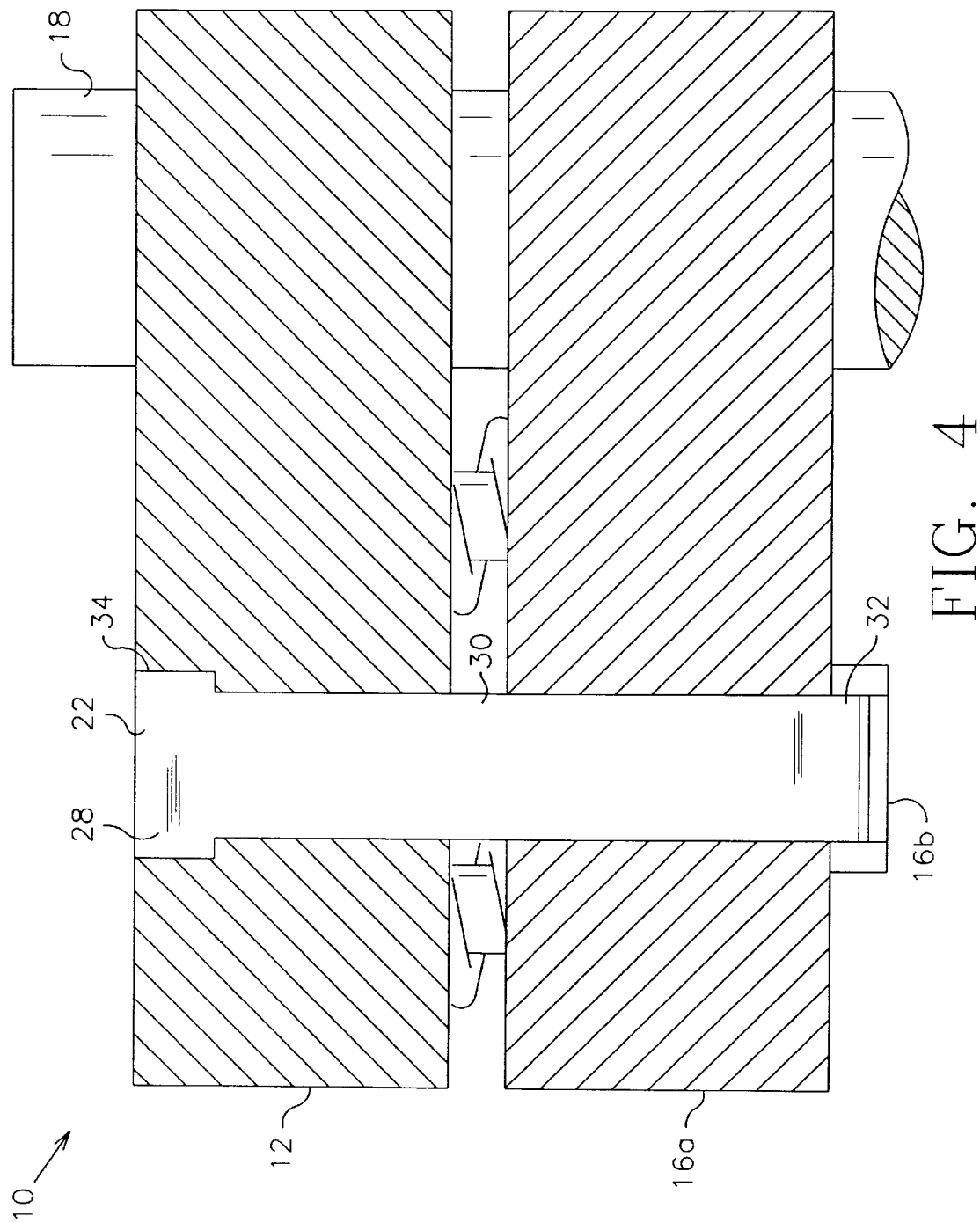
FIG. 4 is a cross section view taken along the line 4—4 in FIG. 1.

Referring to FIGS. 2 and 3, punch 22 is an elongated flat plate that has a length L, width W and depth D. Punch 22 is characterized across its width by a T shaped upper part 28 and an angled face 42. Stem 30 is that portion of punch 22 that extends between upper part 28 and lower part 32. FIG. 4, which is a cross section view taken along the line 4—4 in FIG. 1, shows that upper part 28 of punch 22 fits into a mating recess 34 in punch holder 12. Thus, holder 12 supports punch 22 at the ends of the T shaped upper part 28.

Three different embodiments of holder 12 and punch 22 are shown in FIGS. 5A, 5B and 5C. Each of FIGS. 5A, 5B and 5C is a detail cross section view from FIG. 1 showing different embodiments of the upper part of punch 22 and its position in holder 12. In the embodiment shown in FIG. 5A, upper part 28 of punch 22 is positioned in a comparatively narrow collar portion 35 in punch holder 1 2. Stem 30 extends through a wider opening 24 that forms a conduit portion in punch holder 12. Collar portion 35 and conduit portion 24 define an internal passageway or throughway in punch holder 12. The gap 39 between collar portion 35 and upper part 28 is smaller than the gap 41 between the sidewalls of opening 24 and stem 30. In this embodiment, punch 22 hangs from holder 12 and the punch is free to rotate in holder 12 within the confines of collar portion 35 and opening 24. In the embodiment shown in FIG. 5B, punch 22 is flexibly or bendably coupled to holder 12. The upper part 28 of punch 22 fits tightly in collar portion 35. Stem 30 may flex or bend laterally in opening 24. Gap 41 defines a flexing clearance for stem 30 within opening 24. In a third embodiment shown in FIG. 5C, upper part 28 of punch 22 is also T shaped across its breadth and recess 34 in holder 12 is formed to hold the two dimensional T shaped upper part 28 of punch 22. In the embodiment of FIG. 5C, the collar portion 35 in holder 12 is omitted so that the gap between punch 22 and opening 24 in holder 12 is the same along the length of the punch. In this embodiment, punch 22 hangs from holder 12 and punch 22 is free to rotate in holder 12 within the confines and opening 24 and recess 34.

Figure 6A:
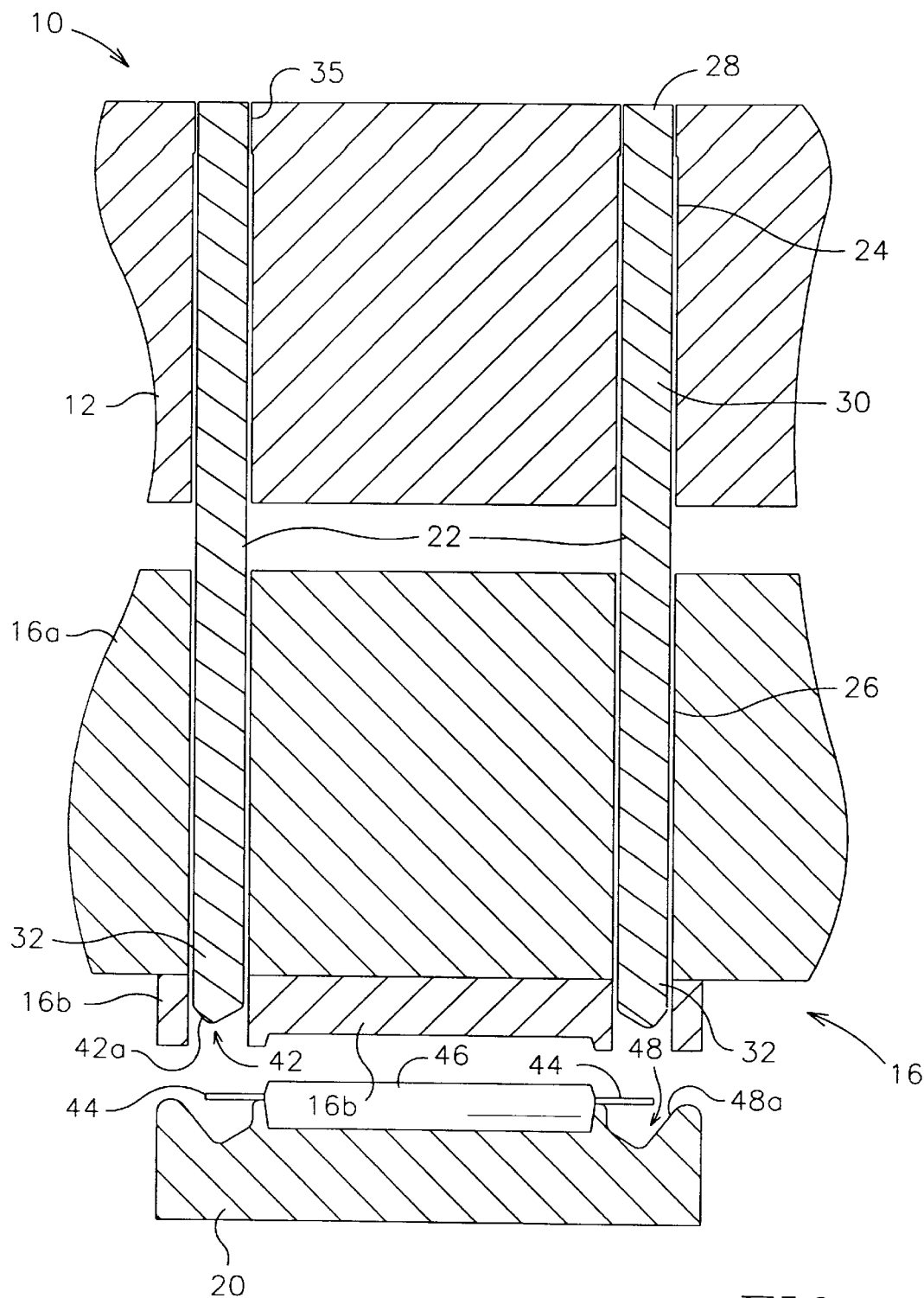
FIGS. 6A–6D are detail cross section views from FIG. 1 showing the punch holder, punch, stripper and die as they move through a lead bending operation.
Figure 6B:
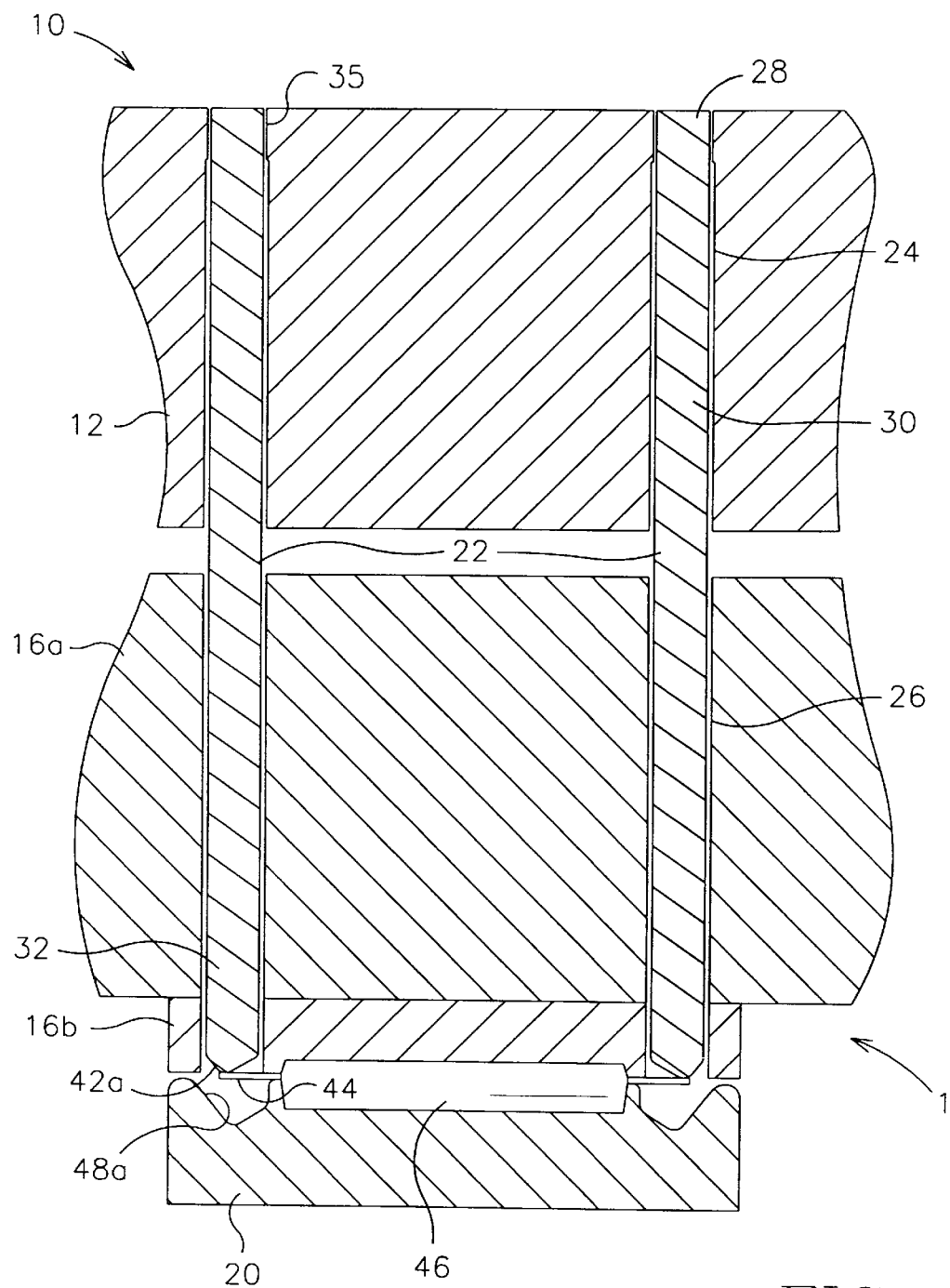
Figure 6C:
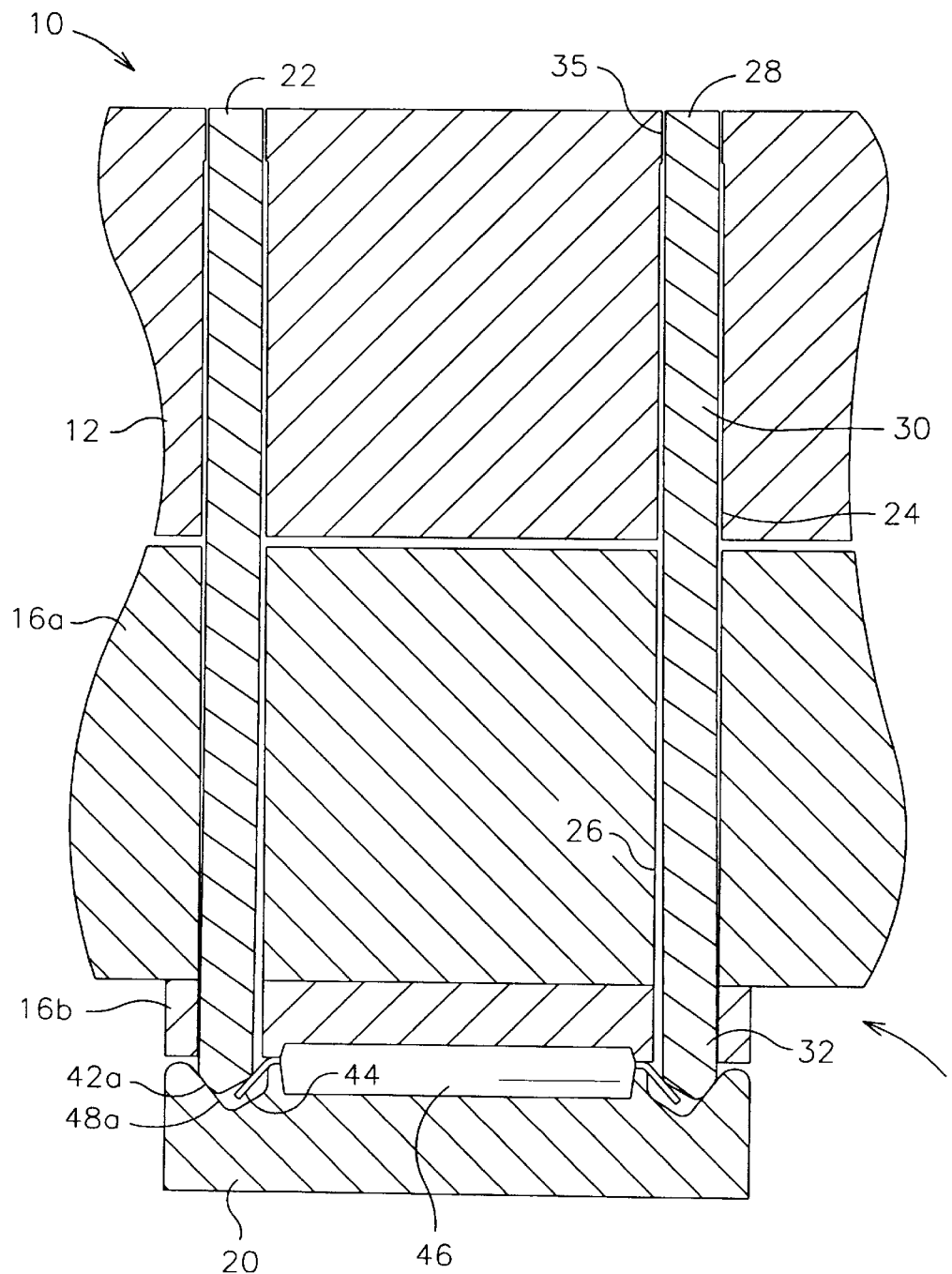
Figure 6D:
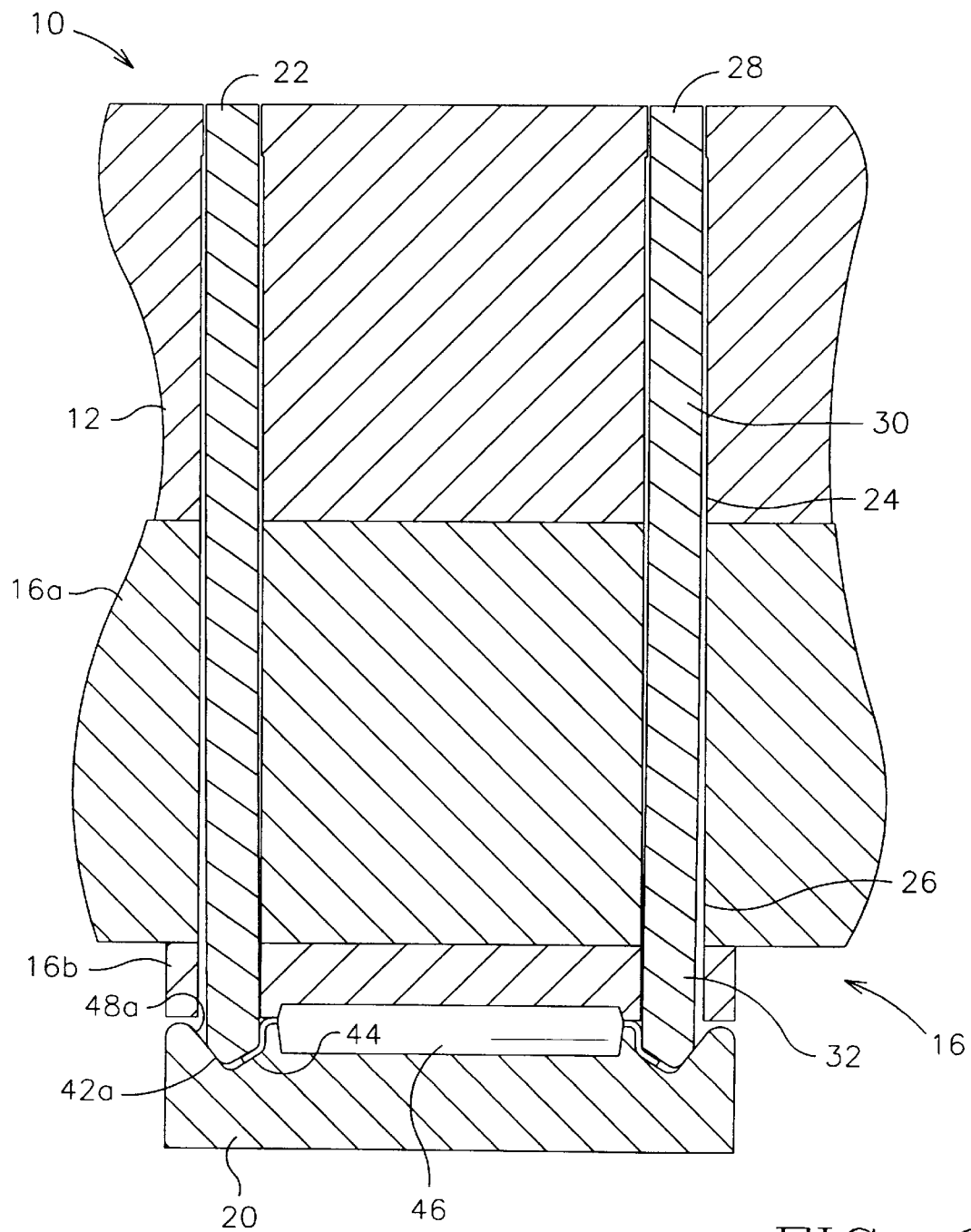

Referring to FIGS. 1 and 6A, the face 42 of punch 22 and the face 48 of die 20 are cooperatively shaped to bend leads 44 on semiconductor package 46 into the desired shape. In the actual operation of a lead forming tool such as that shown and described, the semiconductor packages 46 would be part of a series of packages on a series of lead frame strips. During production of the finished parts, the semiconductor packages are indexed one after another on to dies 20. For purposes of illustrating the invention, only one package is shown on each die and leads 44 are shown partially formed in one bending operation. Leads 44 may be and often are formed into different shapes in one or more bending operations. Face 48 of die 20 is also shaped to move the lower part 32 of punch 22 in as punch 22 contacts die 20.

Figure 7A:
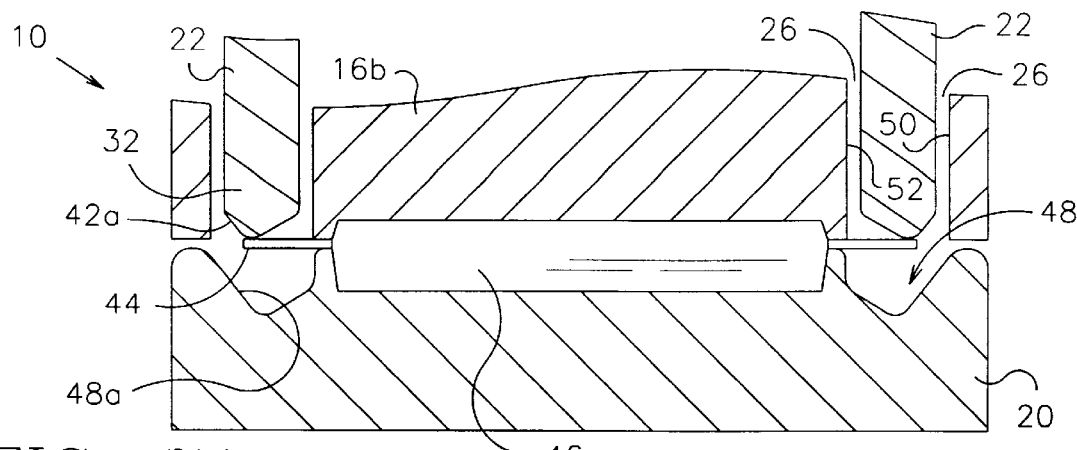
FIGS. 7A–7C are detail cross section views corresponding to the position of the components in FIGS. 6B–6D showing the interaction between the punch and the die as the punch is pressed against the die to bend the conductive leads into the desired shape.
Figure 7B:
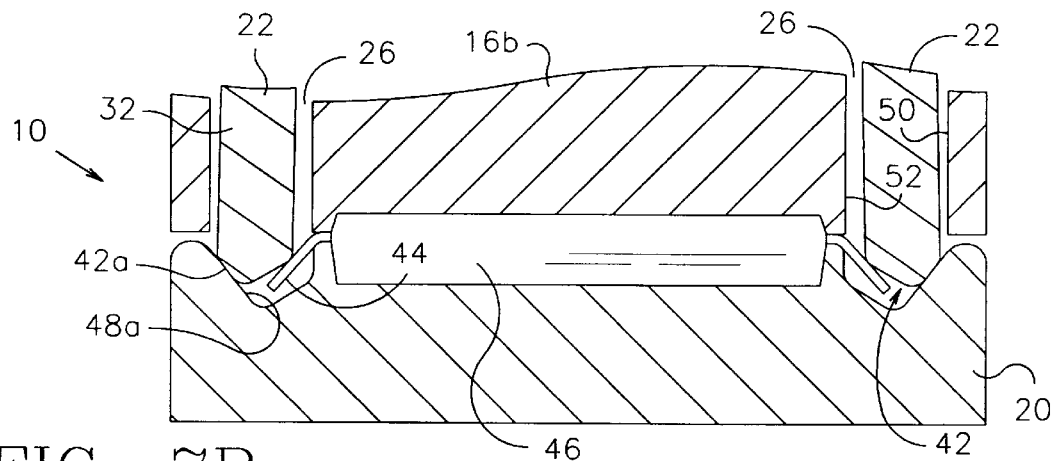
Figure 7C:
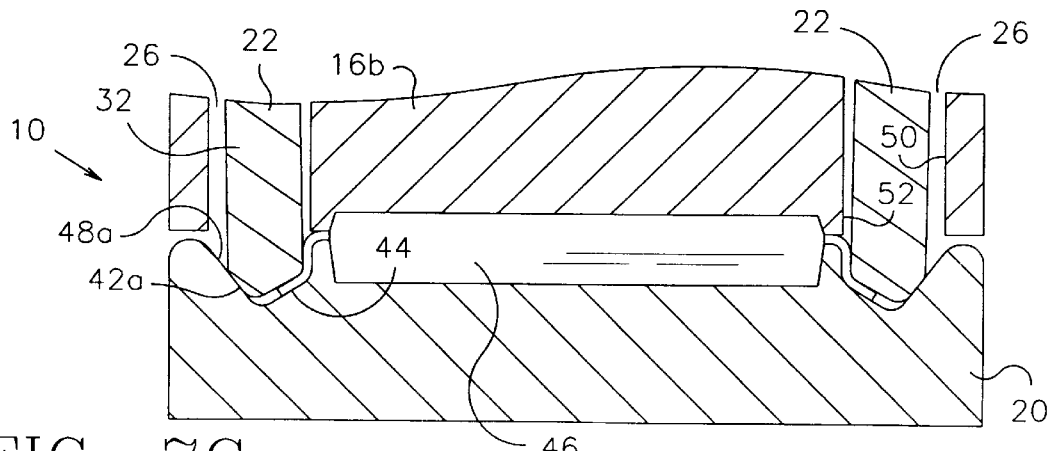

Referring to FIGS. 7A–7C, the lateral movement of lower part 32 of punch 22 is effected by the depth of travel of punch 22 after it contacts die 20 and the angle of outer portion 48a of die face 48. These parameters can be customized for each type of semiconductor package and lead configuration to reduced shear forces on the leads and minimize lead surface damage. The outer portion 42a of punch face 42 is also angled to increase the contact surface area and reduce punch wear.

The operation of lead forming tool 10 will be described with reference to FIGS. 6A–6D and FIGS. 7A–7C. The position of tool 10 in FIGS. 7A, 7B and 7C correspond to the position of tool 10 in FIGS. 6B, 6C and 6D, respectively. In operation, a press (not shown) engages the upper surface of punch holder 12 and presses punch holder 12 and stripper 16 down toward die 20. Stripper 16 is pressed into contact with the roots of conductive leads 44 to hold the package and the leads in place on die 20. The descent of stripper 16 on to package 44 can be seen by comparing FIGS. 6A and 6B. As punch holder 12 continues to descend, punches 22 move past stripper 16 and inside portion 42a of punch face 42 contacts leads 44. As leads 44 begin to bend, and depending on the relative stiffness of leads 44 and punch 22, the leads may deflect lower part 32 of punch 22 away from the center of die 20 towards outer sidewall 50. Depending on the configuration and position of the upper part of the punch as shown in FIGS. 5A, 5B and 5C, punch 22 may pivot and/or flex toward sidewall 50. The deflection of punch can be seen by comparing FIGS. 6B and 6C and FIGS. 7A and 7B. Again, depending on the relative stiffness of leads 44 and punch 22, the lower part 32 of punch 22 may pivot and/or flex until it is blocked by outer portion 48a of die face 48. As punch 22 is pressed fully into die 20, outside portion 48a of die 48 drives lower part 32 of punch 22 toward the center of die 20 to bend leads 44 into the desired shape. When punch holder 12 is released, punch 22 is withdrawn from leads 44 as punch holder 12 moves up, while stripper 16 remains temporarily in place to prevent leads 44 and package 46 from clinging to punch 22. The clearance between punch 22 and the sidewalls 50 and 52 of openings 24 and 26 should be made sufficient to accommodate the full range of motion of punch 22. If necessary or desirable, lower part 32 of punch 22 may be biased against outer sidewall 50 in stripper 16 when the press is open. For a typical lead bending operation, such as the preform on a forty four lead 400 millimeter thin small outlined package (TSOP), the lower part 32 of punch 22 will move laterally about 0.011 inches. This movement may be achieved, for example, with a vertical depth of travel of 0.11 inches and a die face angle of 45°. The small lateral movement of punch 22 necessary to gain the advantages of a pivot punch is achieved without a clearly defined or explicit pivot point. In some applications, a slight clearance is maintained between the upper part 28 of punch 22 and collar portion 35 of punch holder 12 as shown in FIGS. 5A and 5C, in which case punch 22 may pivot in opening 24. In other applications, upper part 28 of punch 22 may be held securely in punch holder 12 as shown in FIG. 5B, in which case the desired lateral movement may be achieved solely through the flexing of punch 22. Or, the lateral movement of punch 22 may be achieved through a combination of punch 22 pivoting and flexing.

Figure 5E:
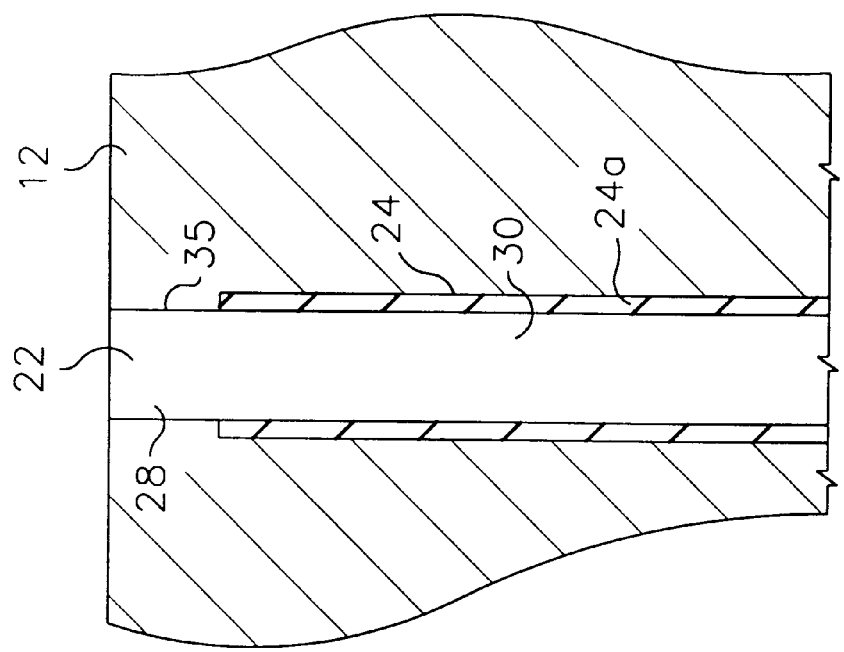
Figure 5D:
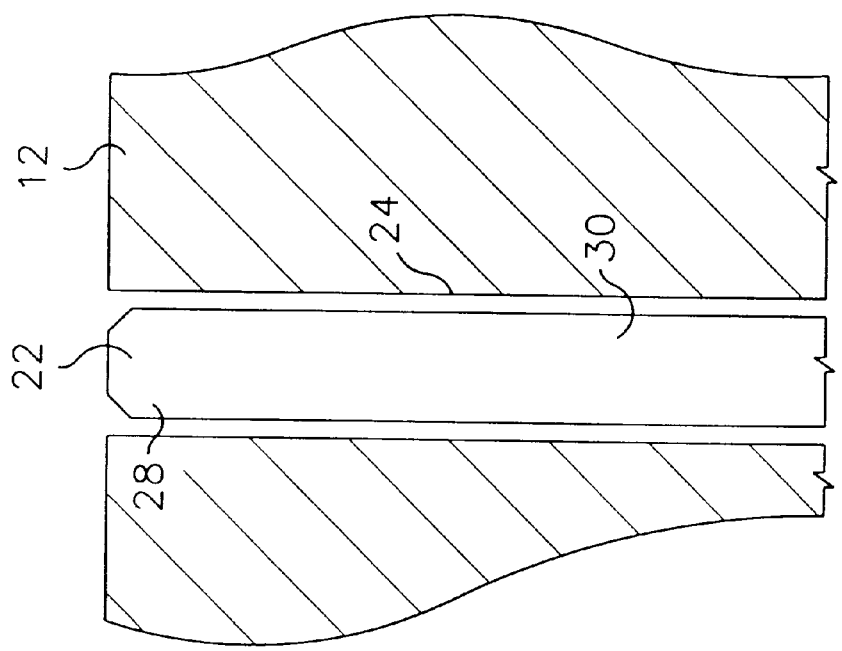

It is expected that the invented lead forming tool will be advantageous over straight punches by reducing shear forces and minimizing lead surface damage. The lead forming tool also provides an effective alternative to conventional pivot punch tooling, particularly for small package spacing applications in which conventional pivot punch tooling is not practical. While the invention has been shown and described with reference to the foregoing exemplary embodiments, it is to be understood that other forms and details of the invention may be made. For example, the sidewalls of opening 24 in holder 12 could be made uniform as shown in FIG. 5D or opening 24 could be made to conform to punch 22 as shown in FIG. 5E. In the embodiment shown in FIG. 5E, a liner 24a made of deformable material such as a urethane rubber allows for the pivotal movement of punch 22 in holder 12. The above described embodiments illustrate but do not limit the invention which is defined in the following claims.

What is claimed is:

1. A forming tool, comprising:

a die;

an elongated flat punch characterized by a length, a width and a depth, the punch having an upper part, a lower part and a stem extending between the upper part and the lower part, the upper part T shaped across its width and the lower part terminating in a face across its width;

a punch holder supporting the punch, the punch holder having a recess sized and shaped to receive the T shaped upper part and an opening formed below the recess, the punch extending through the opening and the recess, and the recess and opening defined in part by sidewalls across the width of the punch and endwalls across the depth of the punch;

a first gap between the stem and the sidewalls of the opening;

the punch holder moveable with the punch along a first line of movement toward and away from the die;

the lower part of the punch moveable along a second line of movement generally perpendicular to the first line of movement; and wherein the upper part of the punch is held securely in the holder and movement of the punch along the second line of movement is characterized by the punch flexing.

2. A forming tool, comprising:

a die;

an elongated flat punch characterized by a length, a width and a depth, the punch having an upper part, a lower part and a stem extending between the upper part and the lower part, the upper part T shaped across its width and the lower part terminating in a face across its width;

a punch holder supporting the punch, the punch holder having a recess sized and shaped to receive the T shaped upper part and an opening formed below the recess, the punch extending through the opening and the recess, and the recess and opening defined in part by sidewalls across the width of the punch and endwalls across the depth of the punch;

a first gap between the stem and the sidewalls of the opening;

the punch holder moveable with the Punch along a first line of movement toward and away from the die;

the lower part of the punch moveable along a second line of movement generally perpendicular to the first line of movement; and wherein the upper part of the punch is held securely in the holder and the lower part of the punch is flexible along the second line of movement.

3. A forming tool, comprising:

a die;

an elongated flat Punch characterized by a length, a width and a depth, the punch having an upper part, a lower part and a stem extending between the upper part and the lower part, the upper part T shaped across its width and the lower part terminating in a face across its width;

a punch holder supporting the punch, the punch holder having a recess sized and shaped to receive the T shaped upper part and an opening formed below the recess, the punch extending through the opening and the recess, and the recess and opening defined in part by sidewalls across the width of the punch and end walls across the depth of the punch;

a first gap between the stem and the sidewalls of the opening;

the punch holder moveable with the punch along a first line of movement toward and away from the die;

the lower part of the punch moveable along a second line of movement generally perpendicular to the first line of movement; and wherein the lower part of the punch is flexible along the second line of movement upon contact with and descent in to the die.

4. A semiconductor lead forming tool, comprising:

a die adapted to support a semiconductor package having a lead extending therefrom;

a punch holder pressable along a path toward the die;

a stripper operatively coupled between the punch holder and the die, the stripper arranged to temporarily hold a semiconductor package in the die;

a lead bending punch, the punch supported by the holder, the punch extending longitudinally through an opening in the holder, and the punch movable longitudinally past the stripper and laterally; and wherein the upper part of the punch is held securely in the holder and the lateral movement of the punch is characterized by the punch flexing.

5. A semiconductor lead forming tool, comprising a flexible punch and a die, the die having an angled face and the punch flexing laterally upon operative engagement with the angled die face.

6. A lead forming tool, comprising:

a punch having an end defining a first punch size and a stem defining a second punch size; and a punch holder housing the punch, the punch holder having surfaces defining an internal passageway and wherein a collar portion of the passageway has a first opening configured to accommodate the end of the Punch and a conduit portion of the passageway has a second opening configured to accommodate the stem of the punch, the second opening being larger than the stem and the first opening is smaller than the second opening.

7. The lead forming tool of claim 6, wherein the first opening is substantially the same size as the end of the punch.

8. A method of forming a semiconductor package lead, comprising the steps of:

supporting a punch in a punch holder;

providing a die under the punch configured to support the lead;

moving the punch along a first line toward and away from the die;

engaging the punch against an angled face on the die; and flexing the punch along a second line generally perpendicular to the first line.

9. A method of shaping a lead, comprising:

interposing the lead between a punch having a punch face and a die having a die face;

providing contact between the lead and the punch;

flexing the punch in a first direction in response to contact with the lead; and flexing the punch in a second direction in response to contact with the die.

10. A method according to claim 9, further comprising providing the punch including the punch face having a first portion cooperatively shaped in relation to an orientation of the lead and wherein the step of flexing the punch in a first direction further comprises interacting the first portion of the punch face with the lead.

11. A method according to claim 10, wherein the step of flexing the punch in a first direction further comprises flexing the punch toward a portion of the die face.

12. A method according to claim 10, wherein the step of flexing the punch in a first direction further comprises flexing the punch toward an outer portion of the die face.

13. A method according to claim 12, wherein the step of flexing the punch in a second direction further comprises flexing the punch in a direction opposite the first direction.

14. A method according to claim 13, wherein the step of providing the punch further comprises providing the punch including the punch face having a second portion cooperatively shaped in relation to the outer portion of the die face and wherein the step of flexing the punch in a second direction further comprises interacting the second portion of the punch face with the outer portion of the die face.

15. A method according to claim 13, further comprising providing the die including the outer portion of the die face being cooperatively shaped in relation to the punch face and wherein the step of flexing the punch in a second direction further comprises interacting the punch face with the outer portion of the die face.

16. A method of positioning a punch within a punch holder, comprising:

defining an opening through the punch holder;

positioning the punch within the opening;

maintaining flexing clearance between the punch and a side of the opening; and wherein the step of defining an opening further comprises defining a collar portion of the opening having less of the flexing clearance than an additional portion of the opening.

17. A method of positioning a punch within a punch holder, comprising:

defining an opening through the punch holder;

positioning the punch within the opening;

maintaining flexing clearance between the punch and a side of the opening; and wherein the step of defining an opening further comprises defining a collar portion of the opening having substantially no flexing clearance at the additional portion of the opening.

18. A method according to claim 17, wherein the step of defining a collar portion further comprises defining the collar portion at one end of the opening.

19. A method according to claim 18, wherein the step of defining an opening further comprises defining an opening having a first end and a second end generally closer than the first end to a face of the punch and wherein the step of defining the collar portion at one end of the opening further comprises defining the collar portion at the first end.

* * * * *